United States Patent [19]
Muraki

[11] Patent Number: 6,137,113
[45] Date of Patent: Oct. 24, 2000

[54] ELECTRON BEAM EXPOSURE METHOD AND APPARATUS

[75] Inventor: Masato Muraki, Inagi, Japan

[73] Assignee: Canon Kabushiki Kaisha, Tokyo, Japan

[21] Appl. No.: 09/092,051

[22] Filed: Jun. 5, 1998

[30] Foreign Application Priority Data

Jun. 11, 1997 [JP] Japan ..................................... 9-153668

[51] Int. Cl.[7] .................................................. H01J 37/302
[52] U.S. Cl. ................................. 250/492.22; 250/492.23
[58] Field of Search ........................ 430/492.22, 492.23, 430/296

[56] References Cited

U.S. PATENT DOCUMENTS

| | | | |
|---|---|---|---|
| 4,974,919 | 12/1990 | Muraki et al. | 350/6.6 |
| 5,153,773 | 10/1992 | Muraki et al. | 359/619 |
| 5,345,292 | 9/1994 | Shiozawa et al. | 355/67 |
| 5,463,497 | 10/1995 | Muraki et al. | 359/618 |
| 5,864,142 | 1/1999 | Muraki et al. | 250/491.1 |
| 5,905,267 | 5/1999 | Muraki | 250/492.22 |
| 5,977,548 | 11/1999 | Oae et al. | 250/492.22 |
| 5,994,709 | 11/1999 | Suzuki | 250/492.22 |

FOREIGN PATENT DOCUMENTS 8-97122  4/1996  Japan .

*Primary Examiner*—Jack Berman
*Attorney, Agent, or Firm*—Fitzpatrick, Cella, Harper & Scinto

[57] ABSTRACT

Feature information used for forming a pattern by exposure is detected on the basis of the input pattern data, so as to determine the minimum deflection width and electron beam diameter. The input pattern data is broken up in units of subfields serving as exposure fields. The reference position of a main deflector upon exposing one selected subfield is determined. Pattern data for the selected subfield is segmented into those in units of elementary electron optical systems, and the ON/OFF pattern of the electron beams to be irradiated is determined in units of predetermined matrix elements. The numbers of electron beams to be simultaneously irradiated are detected in units of matrix elements, and the current density is determined based on the maximum value of the detected numbers. The exposure time at each deflection position is calculated based on the calculated current density, thus determining a deflection cycle that can attain exposure within the shortest period of time. By appropriately setting the current density of the electron beams, maximum throughput with shortest process time can be attained while confining blurring produced by the Coulomb effect within a predetermined value.

25 Claims, 15 Drawing Sheets

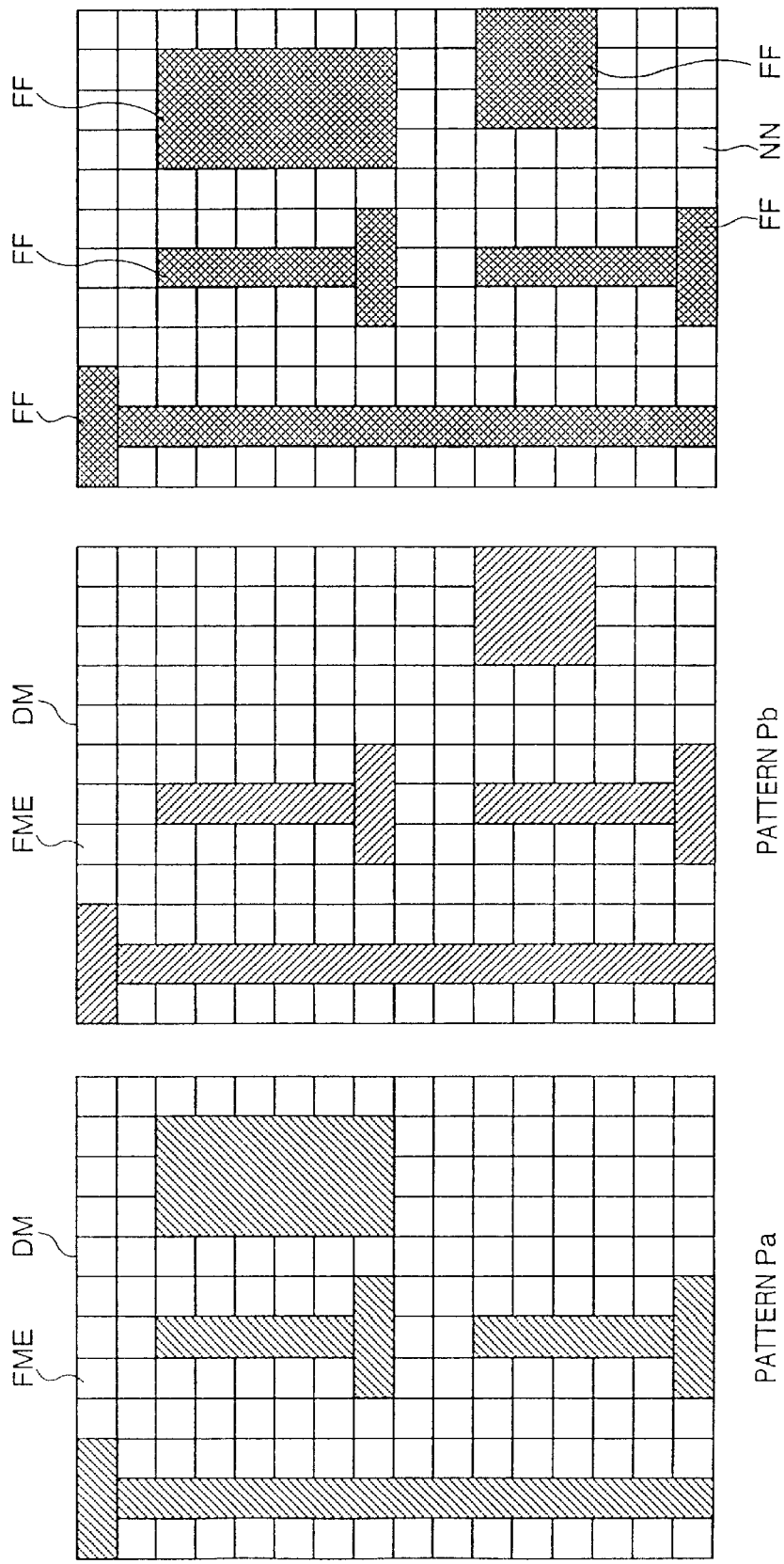

FIG. 12

| MINIMUM DEFLECTION WIDTH | BEAM DIAMETER |
|---|---|
| def | w |

| SUBFIELD No. | REFERENCE POSITION | CURRENT DENSITY | DEFLECTION CYCLE | MATRIX No. | BLANKING CONTROL A(1,1) | A(1,2) | A(1,3) | ... | E(3,9) |
|---|---|---|---|---|---|---|---|---|---|
| 1 | x(1), y(1) | j(1) | Td(1) | m1(1) | on or off | on or off | on or off | ... | on or off |
| | | | | m1(2) | on or off | on or off | on or off | ... | on or off |
| | | | | ... | ... | ... | ... | ... | ... |
| | | | | m1(k) | on or off | on or off | on or off | ... | on or off |
| 2 | x(2), y(2) | j(2) | Td(2) | m2(1) | on or off | on or off | on or off | ... | on or off |
| | | | | m2(2) | on or off | on or off | on or off | ... | on or off |
| | | | | ... | ... | ... | ... | ... | ... |
| | | | | m2(k) | on or off | on or off | on or off | ... | on or off |
| ... | ... | ... | ... | ... | | | | | |
| n | x(n), y(n) | j(n) | Td(n) | mn(1) | on or off | on or off | on or off | ... | on or off |
| | | | | mn(2) | on or off | on or off | on or off | ... | on or off |
| | | | | ... | ... | ... | ... | ... | ... |
| | | | | mn(k) | on or off | on or off | on or off | ... | on or off |

SEMICONDUCTOR DEVICE MANUFACTURING FLOW

ELECTRON BEAM EXPOSURE METHOD AND APPARATUS

BACKGROUND OF THE INVENTION

The present invention relates to an electron beam exposure method and apparatus and, more particularly, to an electron beam exposure method and apparatus for drawing a pattern using a plurality of electron beams for the purpose of directly drawing a pattern on a wafer or exposing a mask or reticle.

In an electron beam exposure apparatus which performs exposure by irradiating an electron beam on a substrate, when the beam current is large, the electron beam image projected onto the substrate blurs due to a Coulomb effect. Most of blurring caused by the Coulomb effect can be corrected by re-adjusting the focal point position of a reduction electron optical system for projecting an electron beam, but some blurring remains uncorrected. In a variable shaping exposure apparatus which shapes the sectional shape of an electron beam within a maximum range of about 10 $\mu m^2$, the blurring produced by the Coulomb effect is predicted from the area of the shaped beam, and apparatus parameters (beam current density, half beam incident angle, beam acceleration voltage, and optical length of the reduction electron optical system), and the focal point of the reduction electron optical system is adjusted in accordance with the prediction result.

In a multi-electron beam exposure apparatus which irradiates an array of a plurality of electron beams in line onto a substrate, deflects these electron beams to scan the substrate, and draws a pattern by individually ON/OFF-controlling the electron beams to be irradiated in correspondence with the pattern to be drawn, since the electron beams are dispersed, i.e., since the effective current density per unit area on the substrate is low, blurring due to the Coulomb effect is small. This means that when the blurring due to the Coulomb effect is confined within a predetermined value, the multi-electron beam exposure apparatus can improve the exposure throughput by applying larger beam currents than the variable shaping exposure apparatus.

In order to confine the blurring due to the Coulomb effect within the predetermined value, in the multi-electron beam exposure apparatus, the current density of each electron beam is limited under the assumption that all the electron beams are irradiated onto the wafer. However, in the multi-electron beam exposure apparatus, since a plurality of electron beams draw different patterns, all the electron beams are rarely irradiated onto the wafer at the same time.

SUMMARY OF THE INVENTION

It is an object of the present invention to provide a multi-electron beam exposure method and apparatus, which can attain maximum throughput with shortest process time while confining the blurring attributed to the Coulomb effect within a predetermined value by appropriately setting the current density of the electron beams. In order to achieve the above object, according to the present invention, an electron beam exposure method, electron beam exposure apparatus, device manufacturing method using the electron beam exposure method, and device manufacturing apparatus using the electron beam exposure apparatus have the following arrangements.

That is, an electron beam exposure method for forming a pattern by exposure on a substrate using a plurality of electron beams, comprises the projection step of projecting the plurality of electron beams onto the substrate via a reduction electron optical system, the deflection step of deflecting the plurality of electron beams to be projected toward the substrate, the control step of individually controlling an ON/OFF pattern of the plurality of electron beams in units of deflection positions, the detection step of detecting, in advance, the number of electron beams to be irradiated onto the substrate in units of deflection positions, and the determination step of determining a current density of the plurality of electron beams on the basis of the detected number of electron beams.

An electron beam exposure apparatus for forming a pattern by exposure on a substrate using a plurality of electron beams, comprises a reduction electron optical system for projecting the plurality of electron beams onto the substrate, deflection means for deflecting the plurality of electron beams to be projected toward the substrate, irradiation control means for individually controlling an ON/OFF pattern of the plurality of electron beams in units of deflection positions, current adjustment means for adjusting a current of the plurality of electron beams, and control means for controlling the current adjustment means to adjust a current density of the plurality of electron beams on the basis of the pre-detected number of electron beams to be irradiated onto the substrate in units of deflection positions.

A multi-electron beam exposure method and apparatus, which can attain maximum throughput with shortest process time while confining the blurring ascribed to the Coulomb effect within the predetermined value by appropriately setting the current densities of the respective electron beams can be provided.

An electron beam exposure method comprises the feature information detection step of detecting feature information used for forming a pattern by exposure on the basis of input pattern data, the feature information determination step of determining a minimum deflection width and electron beam diameter on the basis of the detected feature information, the data segmentation step of segmenting data in units of subfields serving as exposure fields on the basis of the input pattern data, the subfield selection step of selecting one subfield, the reference position determination step of determining a reference position of a main deflector upon exposing the selected subfield, the irradiation determination step of segmenting pattern data for the selected subfield into pattern data in units of elementary electron optical systems, and determining an ON/OFF pattern of electron beams in units of predetermined matrix elements, the irradiated electron beam number detection step of detecting the numbers of electron beams to be simultaneously irradiated in units of matrix elements, the current density determination step of calculating a current density on the basis of a maximum value of the numbers of electron beams to be simultaneously irradiated in units of matrix elements, and the deflection cycle determination step of calculating an exposure time at a deflection position on the basis of the calculated current density to attain exposure within a shortest period of time.

According to a preferred aspect of the present invention, the detection step includes the step of detecting, in advance, the number of electron beams to be irradiated onto the substrate in units of deflection positions on the basis of pattern data of the pattern.

According to a preferred aspect of the present invention, the method further comprises the deflection cycle determination step of determining a deflection cycle upon deflecting the plurality of beams on the basis of the current density of the plurality of electron beams determined in the determination step.

According to a preferred aspect of the present invention, the determination step includes the step of determining the current density of the plurality of electron beams within a predetermined deflection region on the basis of a maximum value of the detected numbers of electron beams in units of deflection positions within the deflection region.

According to a preferred aspect of the present invention, the current density of the plurality of electron beams is set constant within the deflection region.

According to a preferred aspect of the present invention, the plurality of electron beams are those coming from an electron source for emitting electrons, and the method further comprises the luminance adjustment step of adjusting a luminance of the electron source on the basis of the determined current density of the plurality of electron beams.

According to a preferred aspect of the present invention, the method further comprises the beam size adjustment step of adjusting sizes of the plurality of electron beams on the basis of the adjusted luminance of the electron beam.

According to a preferred aspect of the present invention, the method further comprises the position adjustment step of adjusting positions of the plurality of electron beams on the basis of the adjusted luminance of the electron beam.

According to a preferred aspect of the present invention, device manufacturing method of manufacturing a device by forming a pattern by exposure on a substrate using a plurality of electron beams, is characterized in that an electron beam exposure method of the present invention is used as an electron beam exposure method using the plurality of electron beams.

According to a preferred aspect of the present invention, the control means adjusts a deflection cycle of the deflection means upon deflecting the plurality of electron beams on the basis of the adjusted current density of the plurality of electron beams.

According to a preferred aspect of the present invention, the control means controls the current adjustment means to adjust the current density of the plurality of electron beams within a predetermined deflection region on the basis of a maximum value of the numbers of electron beams in units of deflection positions within the deflection region.

According to a preferred aspect of the present invention, the current adjustment means sets the current density of the plurality of electron beams to be constant within the deflection region.

According to a preferred aspect of the present invention, the plurality of electron beams are those coming from an electron source for emitting electrons, and the apparatus further comprises luminance adjustment means for adjusting a luminance of the electron source on the basis of the current density of the plurality of electron beams adjusted by the current adjustment means.

According to a preferred aspect of the present invention, the apparatus further comprises shape adjustment means for adjusting sizes of the plurality of electron beams on the basis of the adjusted luminance of the electron beam.

According to a preferred aspect of the present invention, the apparatus further comprises position adjustment means for adjusting positions of the plurality of electron beams on the basis of the adjusted luminance of the electron beam.

According to a preferred aspect of the present invention, device manufacturing apparatus for manufacturing a device by forming a pattern by exposure on a substrate using a plurality of electron beams, is characterized in that an electron beam exposure apparatus of the present invention is used as an electron beam exposure apparatus using the plurality of electron beams.

According to a preferred aspect of the present invention, the feature information is a minimum line width of the pattern.

According to a preferred aspect of the present invention, the feature information is a type of line width of the pattern.

According to a preferred aspect of the present invention, the feature information is a shape of the pattern.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention, and together with the description, serve to explain the principles of the invention.

FIG. 11A is a view for explaining the process of determining the exposure patterns to be drawn by the respective elementary electron optical systems and the matrix regions defined by a deflector;

FIG. 11B is a view for explaining the process of determining the exposure patterns to be drawn by the respective elementary electron optical systems and the matrix regions defined by the deflector;

FIG. 11C is a view for explaining the matrix positions of matrix elements to be exposed;

FIG. 12 is a view for explaining exposure control data;

DETAILED DESCRIPTION OF THE INVENTION

Preferred embodiments of the present invention will be described in detail in accordance with the accompanying drawings.

(First Embodiment)
(Explanation of Constituting Elements of Electron Beam Exposure Apparatus)

Figure 1:
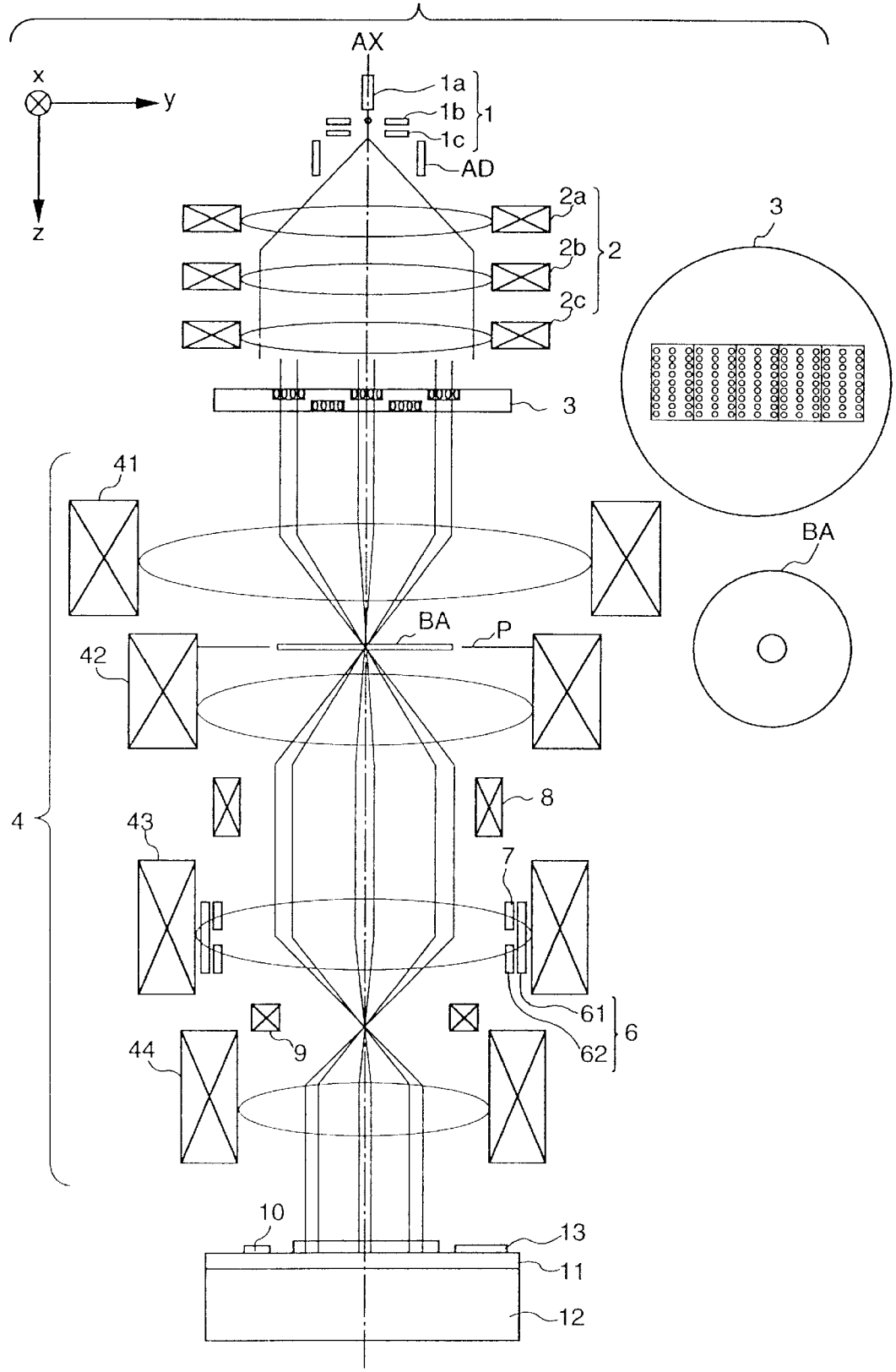
FIG. 1 is a schematic view showing principal part of an electron beam exposure apparatus according to the present invention.

FIG. 1 is a schematic view showing principal part of an electron beam exposure apparatus according to the present invention.

Referring to FIG. 1, reference numeral 1 denotes an electron gun made up of a cathode 1a, grid 1b, and anode 1c. Electrons emitted by the cathode 1a form a crossover image between the grid 1b and anode 1c (the crossover image will be referred to as an electron source hereinafter).

Figure 2:
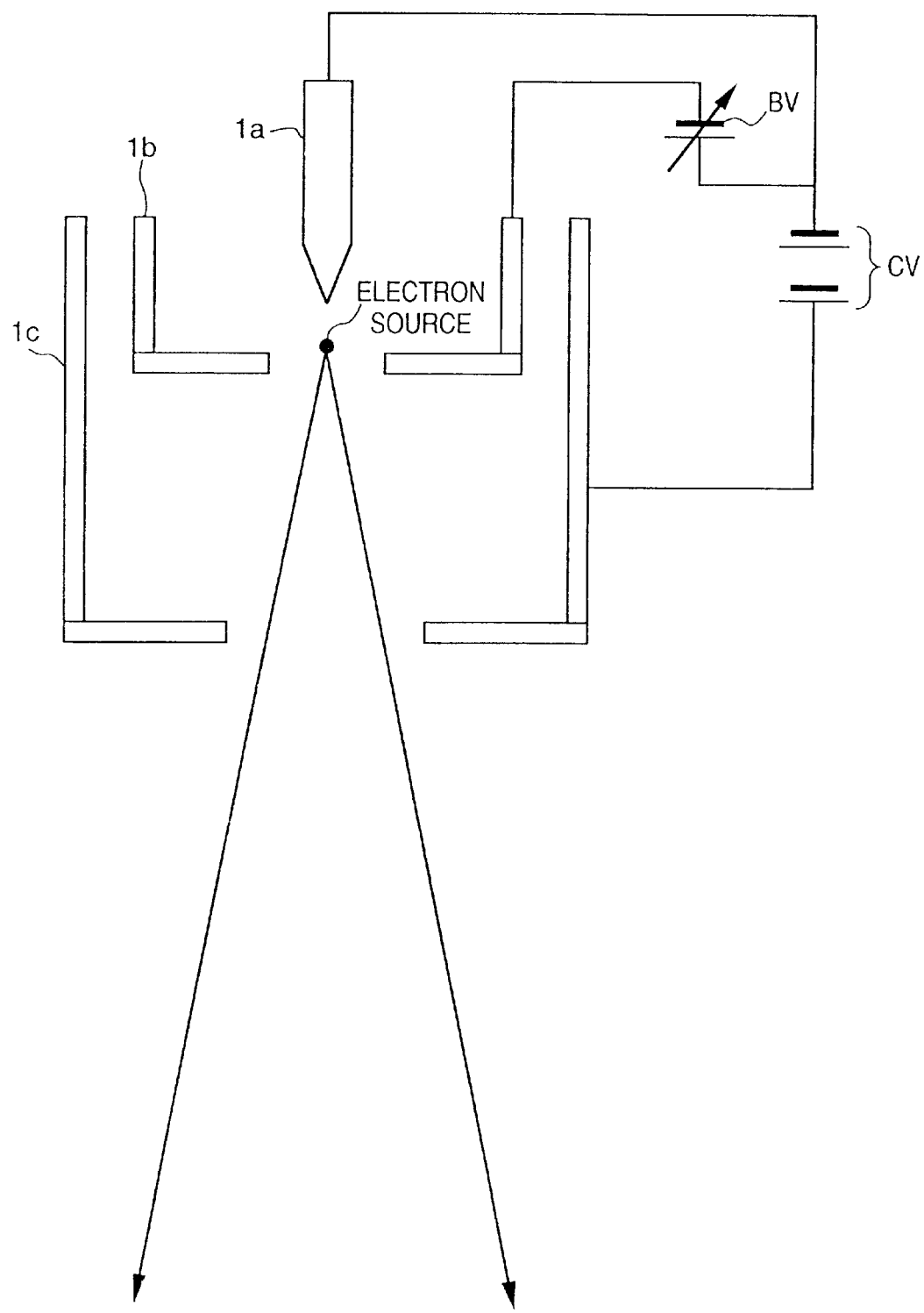
FIG. 2 is a view for explaining an electron gun 1.

FIG. 2 shows the electron gun in more detail. Reference symbol CV denotes a constant power supply for supplying a constant voltage; and BV, a bias power supply that can vary the voltage. The bias power supply applies, to the grid 1b, a bias potential which is negative with respect to the cathode 1a. The constant power supply CV applies, to the first anode 1c, a potential which is positive with respect to the cathode 1a. By changing the voltage of the bias power supply BV, the luminance (A/sr/cm$^2$) of the electron source is changed.

Referring back to FIG. 1, electrons coming from this electron source are converted into nearly collimated electron beams by an illumination electron optical system 2 whose front-side focal point position is located at the electron source position. The nearly collimated electron beams illuminate an elementary optical system array 3. The illumination electron optical system 2 is made up of electron lenses 2a, 2b, and 2c. By adjusting the electron optical powers (focal lengths) of at least two of the electron lenses 2a, 2b, and 2c, the focal length of the illumination electron optical system 2 can be changed while holding its focal point position on the electron source side.

In other words, the focal length of the illumination electron optical system 2 can be changed while obtaining nearly collimated electron beams from the illumination electron optical system 2.

The nearly collimated electron beams coming from the illumination electron optical system 2 enter the elementary electron optical system array 3. The elementary electron optical system array 3 is formed by arranging a plurality of elementary electron optical systems, each consisting of an aperture, electron lens, and blanking electrode, in directions perpendicular to an optical axis AX. The elementary electron optical system 3 will be explained in detail later.

The elementary electron optical system array 3 forms a plurality of intermediate images of the electron source. These intermediate images are projected in a reduced scale by a reduction electron optical system 4 (to be described later), and form electron source images having roughly equal sizes on a wafer 5. Note that the size Wm of the intermediate image of the electron source is given by:

$$Wm = Ws \times Fe/Fi \quad (1)$$

where Ws is the size of the electron source, Fi is the focal length of the illumination electron optical system 2, and Fe is the focal length of each electron optical system of the elementary electron optical system.

Hence, when the focal length of the illumination electron optical system 2 is changed, the sizes of the plurality of intermediate images of the electron source can be changed at the same time. This means that the sizes of a plurality of electron source images on the wafer 5 can be changed at the same time.

Upon changing the luminance (A/sr/cm$^2$) of the electron source or the focal length of the illumination electron optical system 2, the optical axis of the illumination electron optical system may change accordingly. More specifically, the positional relationship between the illumination electron optical system 2 and electron source changes before and after the focal length of the illumination electron optical system 2 is changed. As a consequence, the positions of the intermediate images of the electron source deviate before and after the luminance of the electron source is changed or the focal length of the illumination electron optical system 2 is changed, and the plurality of electron source images on the wafer 5 undergo position deviations before and after the luminance of the electron source is changed or the focal length of the illumination electron optical system 2 is changed. Reference symbol AD denotes an axis adjustment deflector for moving the position of the electron source relative to the illumination electron optical system 2 in the X- and Y-directions. By adjusting the position of the electron source relative to the illumination electron optical system 2, position deviations of the intermediate images of the electron source before and after the change in luminance of the electron source or focal length of the illumination electron optical system 2 are corrected, thereby correcting position deviations of the plurality of electron images on the wafer 5.

The focal lengths and the like of elementary electron optical systems are set to obtain nearly equal sizes of the electron source images on the wafer 5. Furthermore, the elementary electron optical system array 3 makes the positions of the individual intermediate images differ in the optical axis direction in correspondence with the curvature of field of the reduction electron optical system 4, and corrects in advance any aberrations expected to be produced when the individual intermediate images are projected onto the wafer 5 in a reduced scale by the reduction electron optical system 4.

The reduction electron optical system 4 comprises a symmetric magnetic doublet consisting of a first projection lens 41 (43) and second projection lens 42 (44). If f1 represents the focal length of the first projection lens 41 (43), and f2 represents the focal length of the second projection lens 42 (44), the distance between these two lenses is f1+f2. The object point on the optical axis AX is located at the focal point position of the first projection lens 41 (43), and its image point is formed at the focal point of the second projection lens 42 (44).

This image is reduced to −f2/f1. Since two lens magnetic fields are determined to act in opposite directions, the Seidel aberrations and chromatic aberrations pertaining to rotation and magnification theoretically cancel each other, except for five aberrations, i.e., spherical aberration, isotropic astigmatism, isotropic coma, curvature of field, and on-axis chromatic aberration.

Reference numeral 6 denotes a deflector for deflecting a plurality of electron beams coming from the elementary electron optical system array 3 to displace a plurality of electron source images by nearly equal deflection widths in the X- and Y-directions on the wafer 5. The deflector 6 comprises a main deflector 61 which has a large deflection width but requires a long time until settlement, i.e., a long settlement wait time, and a sub deflector 62 which has a small deflection width but requires only a short settlement wait time. The main deflector 61 is an electromagnetic type deflector, and the sub deflector 62 is an electrostatic type deflector.

Reference numeral 7 denotes a dynamic focus coil that corrects any deviations of the focus positions of the electron source images arising from deflection aberration produced upon operation of the deflector 6; and 8, a dynamic stigmatic coil that corrects astigmatism of deflection aberration produced upon deflection as in the dynamic focus coil 7.

Reference numeral 9 denotes a refocus coil for adjusting the focal point position of the reduction electron optical system 4 to correct blurring of electron beams due to the Coulomb effect produced when the number of a plurality of electron beams to be irradiated onto a wafer or the sum total of currents to be irradiated onto the wafer becomes large.

Reference numeral 10 denotes a Faraday cup having two single knife edges respectively extending in the X- and Y-directions. The Faraday cup detects the charge amount of electron source images formed by the electron beams coming from the elementary electron optical systems.

Reference numeral 11 denotes a θ-Z stage that carries a wafer, and is movable in the direction of the optical axis AX (Z-axis) and in the direction of rotation about the Z-axis. A stage reference plate 13 and the Faraday cup 10 are fixed on the stage 11.

Reference numeral 12 denotes an X-Y stage which carries the θ-Z stage and is movable in the X- and Y-directions perpendicular to the direction of the optical axis AX (Z-axis).

Figure 3:
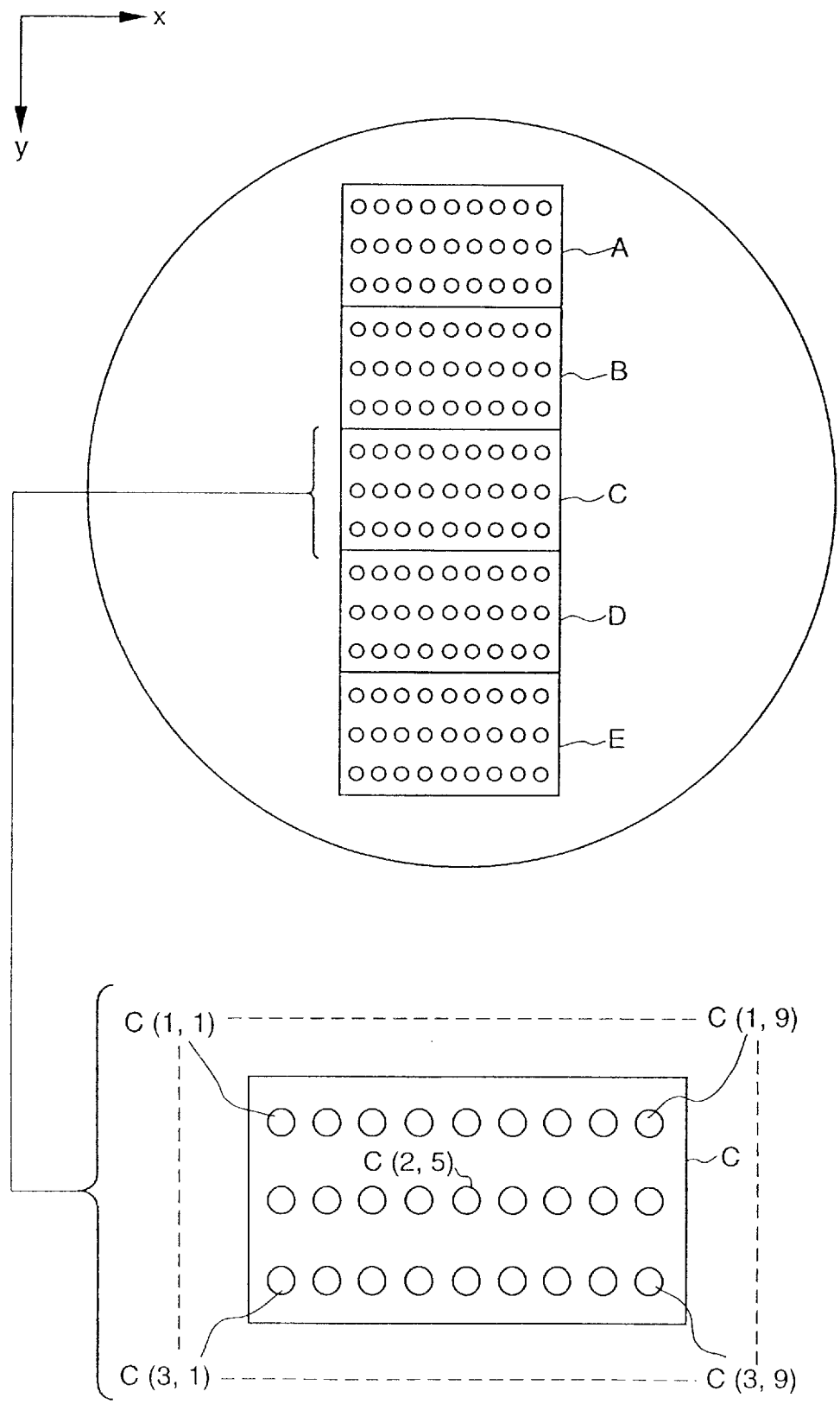
FIG. 3 is a view for explaining an elementary electron optical system array 3.

The elementary electron optical system array 3 will be explained below with reference to FIG. 3.

In the elementary electron optical system array 3, a plurality of elementary electron optical systems form a group (subarray), and a plurality of subarrays are formed. In the example shown in FIG. 3, five subarrays A to E are formed. In each subarray, a plurality of elementary electron optical systems are two-dimensionally arranged. In each subarray of this embodiment, 27 elementary electron optical systems (e.g., C(1,1) to C(3,9)) are formed.

Figure 4:
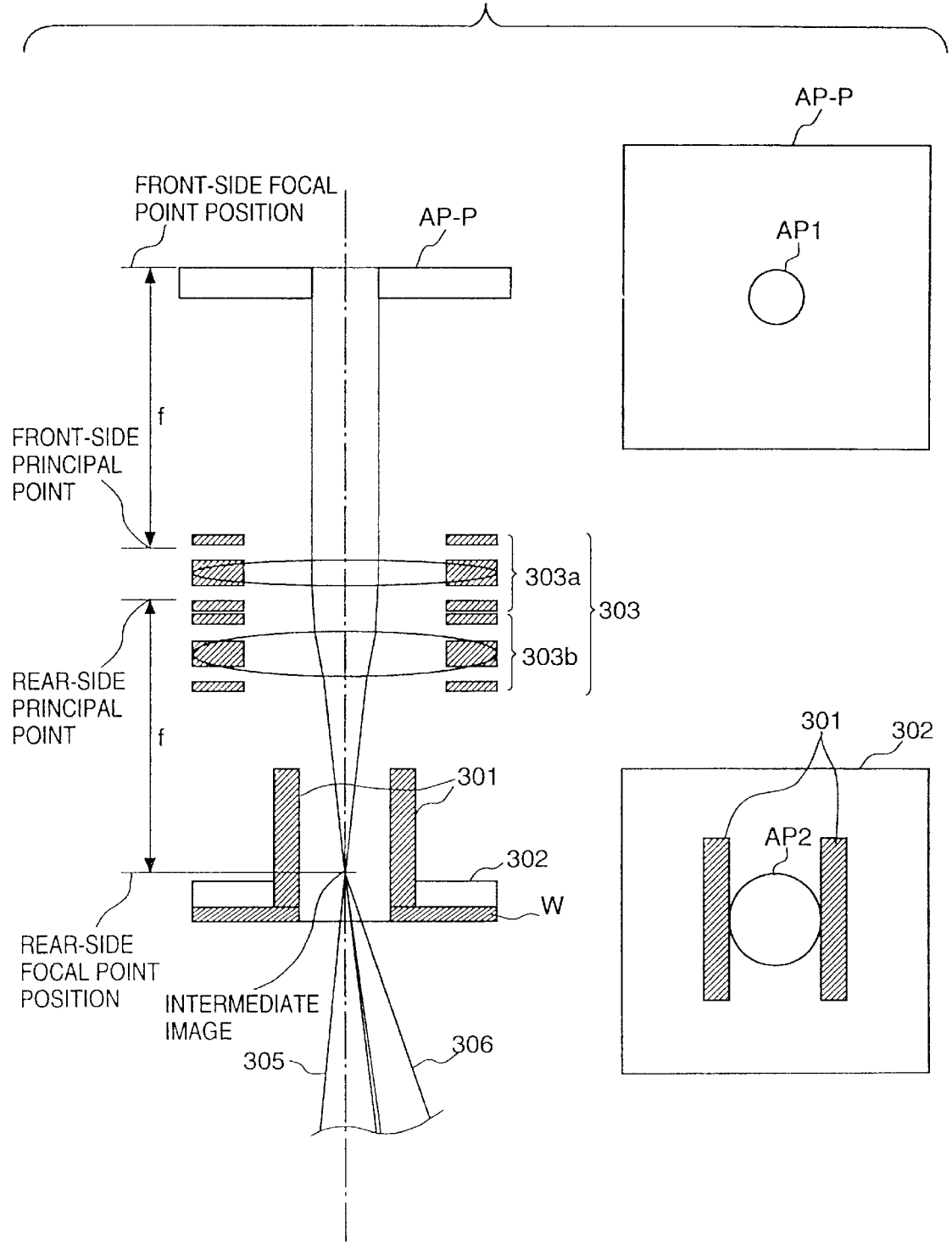
FIG. 4 is a view for explaining an elementary electron optical system.

FIG. 4 is a sectional view of each elementary electron optical system.

Referring to FIG. 4, a substrate AP-P is irradiated with electron beams nearly collimated by the illumination electron optical system 2. The substrate AP-P has an aperture (AP1) that defines the shape of electron beams to be transmitted, and is common to other elementary electron optical systems. That is, the substrate AP-P is a substrate having a plurality of apertures.

Reference numeral 301 denotes a blanking electrode which is made up of a pair of electrodes and has a deflection function; and 302, a substrate which has an aperture (AP2) larger than the aperture (AP1) and is common to other elementary electron optical systems. On the substrate 302, the blanking electrode 301 and wiring (W) for turning on/off the electrodes are formed. That is, the substrate 302 has a plurality of apertures and a plurality of blanking electrodes.

Reference numeral 303 denotes an electron optical system, which uses two unipotential lenses 303$a$ and 303$b$. Each unipotential lens is made up of three aperture electrodes, and has a convergence function by setting the upper and lower electrodes at the same potential as an acceleration potential V0, and keeping the intermediate electrode at another potential V1 or V2. The individual aperture electrodes are stacked on a substrate via insulating materials, and the substrate is common to other elementary electron optical systems. That is, the substrate has a plurality of electron optical systems 303.

Figure 5A:
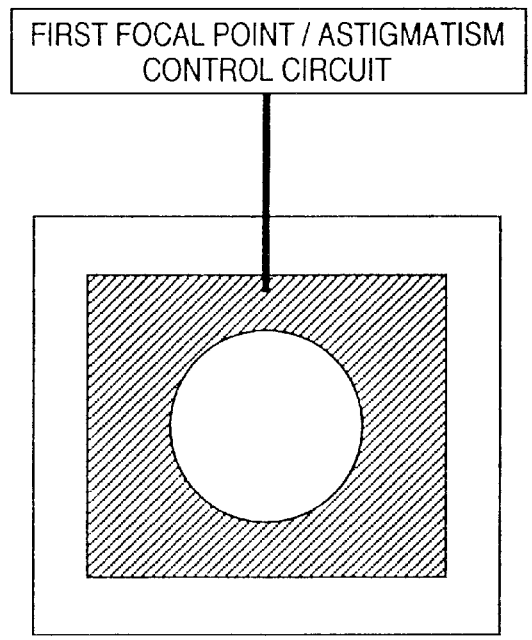
FIG. 5A is a view for explaining the arrangement of the upper, intermediate, and lower electrodes of a unipotential lens 303a and the lower and upper electrodes of a unipotential lens 303b.

The upper, intermediate, and lower electrodes of the unipotential lens 303$a$ and the upper and lower electrodes of the unipotential lens 303$b$ have a shape shown in FIG. 5A, and the upper and lower electrodes of the unipotential lenses 303$a$ and 303$b$ are set at common potential in all the elementary electron optical systems by a first focal point/astigmatism control circuit (to be described later).

Since the potential of the intermediate electrode of the unipotential lens 303$a$ can be set by the first focal point/astigmatism control circuit in units of elementary electron optical systems, the focal length of the unipotential lens 303$a$ can be set in units of elementary electron optical systems.

Figure 5B:
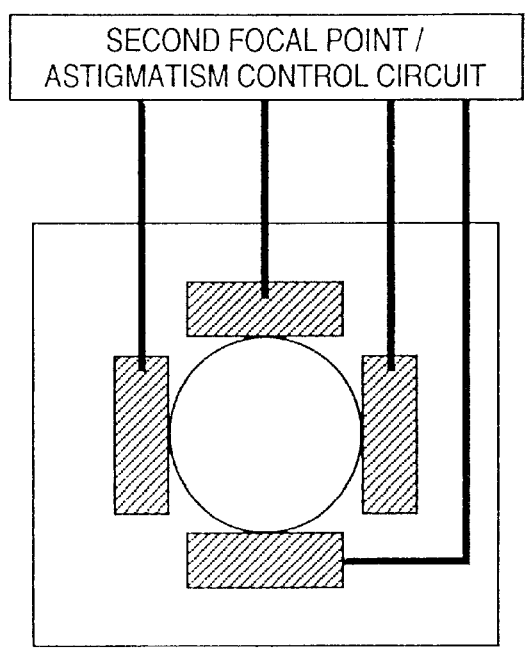
FIG. 5B is a view for explaining the arrangement of the intermediate electrode of the unipotential lens 303b.

The intermediate electrode of the unipotential lens 303$b$ is made up of four electrodes, as shown in FIG. 5B, and the potentials of these electrodes can be set independently and also individually in units of elementary electron optical systems by the focal point astigmatism control circuit. Hence, the unipotential lens 303$b$ can have different focal lengths in a section perpendicular to its optical axis and can set them individually in units of elementary electron optical systems.

As a consequence, by respectively controlling the potentials of the intermediate electrodes of the electron optical systems 303, the electron optical characteristics (the intermediate image forming positions and astigmatism) of the elementary electron optical systems can be controlled. Upon controlling the intermediate image forming positions, since the size of each intermediate image is determined by the ratio between the focal lengths of the illumination electron optical system 2 and each electron optical system 303, the intermediate image forming position is moved by setting a constant focal length of each electron optical system 303 and moving its principal point position. With this control, the intermediate images formed by all the elementary electron optical systems can have nearly equal sizes and different positions in the optical axis direction.

In FIG. 4, each nearly collimated electron beam output from the illumination electron optical system 2 forms an intermediate image of the electron source via the aperture (AP1) and electron optical system 303. Note that the aperture (AP1) is located at or in the vicinity of the front-side focal point position of the corresponding electron optical system 303, and the blanking electrode 301 is located at or in the vicinity of the intermediate image forming position (rear-side focal point position) of the corresponding electron optical system 303. For this reason, if no electric field is applied across the electrodes of the blanking electrode 301, the electron beam is not deflected, as indicated by an electron beam 305 in FIG. 4. On the other hand, if an electric field is applied across the electrodes of the blanking electrode 301, the electron beam is deflected, as indicated by an electron beam 306 in FIG. 4.

Since the electron beams 305 and 306 have different angle distributions on the object plane of the reduction electron optical system 4, they become incident on different regions at the pupil position (on a plane P in FIG. 1) of the reduction electron optical system 4.

Hence, a blanking aperture BA that transmits the electron beam 305 alone is formed at the pupil position (on the plane P in FIG. 1) of the reduction electron optical system.

In the electron lenses of each elementary electron optical system, the potentials of the two intermediate electrodes of the electron optical system 303 are individually set so as to correct the curvature of field and astigmatism produced when the intermediate images formed thereby are projected in a reduced scale onto the surface to be exposed by the reduction electron optical system 4, thereby making the electron optical characteristics (intermediate image forming positions and astigmatism) of the elementary electron optical systems different. However, in this embodiment, in order to decrease the number of wiring lines between the intermediate electrodes and the first focal point/astigmatism control circuit, the elementary electron optical systems included in a single subarray have identical electron optical characteristics, and the electron optical characteristics (intermediate image forming positions and astigmatism) of the elementary electron optical systems are controlled in units of subarrays.

Furthermore, in order to correct distortion produced when a plurality of intermediate images are projected in a reduced scale onto the surface to be exposed by the reduction electron optical system 4, the distortion characteristics of the reduction electron optical system 4 are detected in advance, and the positions of the elementary electron optical systems in directions perpendicular to the optical axis of the reduction electron optical system 4 are set based on the detected characteristics.

Figure 6:
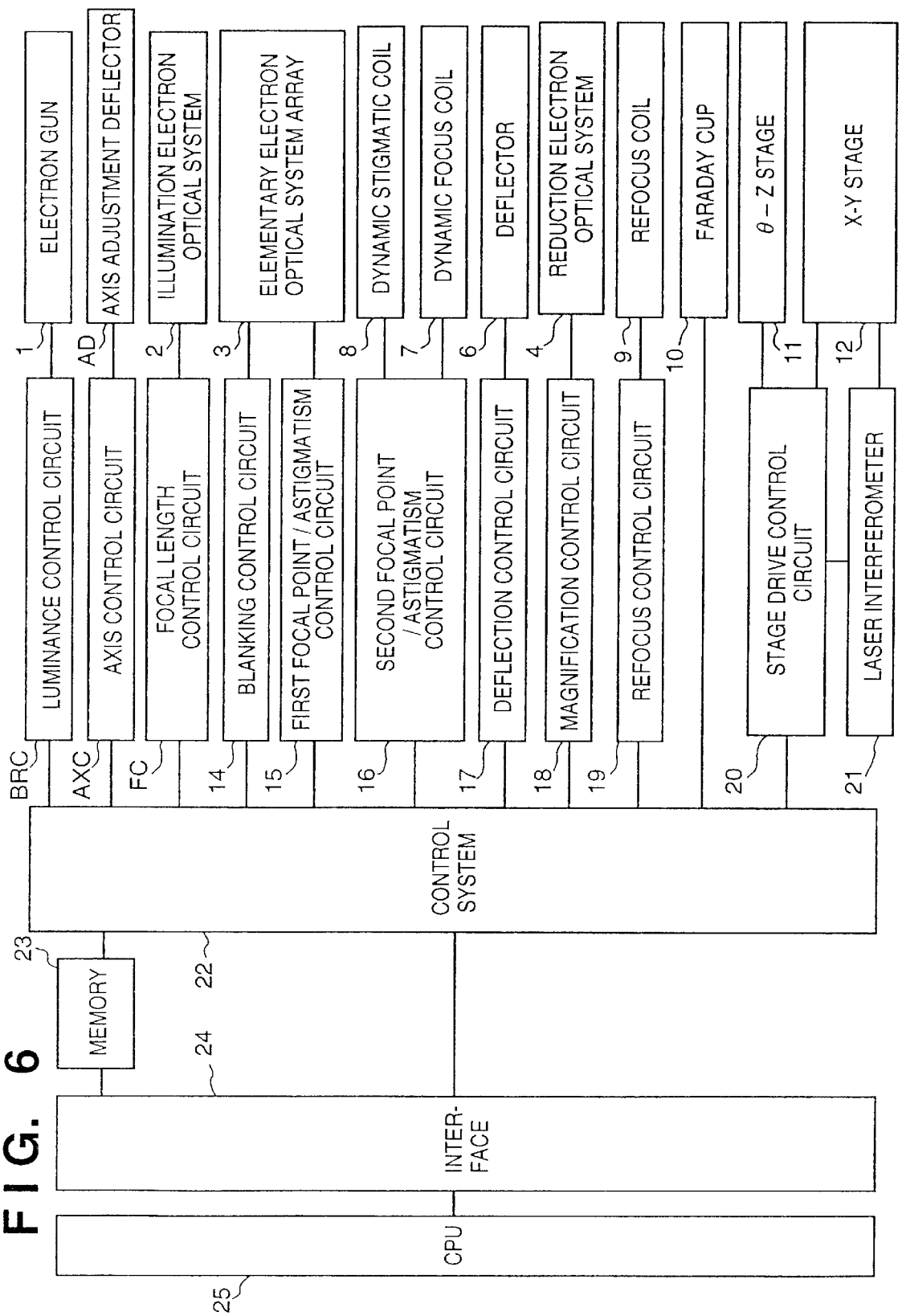
FIG. 6 is a block diagram for explaining the system arrangement according to the present invention.

FIG. 6 shows the system arrangement of this embodiment. A luminance control circuit BRC controls the voltage of the bias power supply BV of the electron gun 1 so as to control the current density of the electron beams to be projected onto the wafer by changing the luminance (A/sr/cm$^2$) of the electron source. An axis control circuit AXC controls the axis adjustment deflector AD to correct position deviations of the intermediate images of the electron source before and after the change in focal length of the illumination electron optical system 2. A focal length control circuit FC controls the focal length of the illumination electron optical system 2 while holding its focal point position on the electron source side, by adjusting the electron optical powers (focal lengths) of at least two of the electron lenses 2a, 2b, and 2c.

A blanking control circuit 14 individually ON/OFF-controls the blanking electrodes of the elementary electron optical systems in the elementary electron optical system array 3, and a first focal point/astigmatism control circuit 15 individually controls the electron optical characteristics (intermediate image forming positions and astigmatism) of the elementary electron optical systems in the elementary electron optical system array 3.

A second focal point-astigmatism control circuit 16 controls the focal point position and astigmatism of the reduction electron optical system 4 by controlling the dynamic stigmatic coil 8 and dynamic focus coil 7. A deflection control circuit 17 controls the deflector 6. A magnification adjustment circuit 18 adjusts the magnification of the reduction electron optical system 4. A refocus control circuit 19 adjusts the focal point position of the reduction electron optical system 4 by controlling the currents to be supplied to the refocus coil 9.

A stage drive control circuit 20 controls driving of the θ-Z stage, and also controls driving of the X-Y stage 12 in collaboration with a laser interferometer 21 that detects the position of the X-Y stage 12.

A control system 22 synchronously controls the above-mentioned control circuits, refocus coil 9, and Faraday cup 10 to attain exposure and alignment based on exposure control data from a memory 23. The control system 22 is controlled by a CPU 25 for controlling the entire electron beam exposure apparatus via an interface 24.

(Explanation of Exposure Operation)

Exposure operation by the electron beam exposure apparatus of this embodiment will be explained below with the aid of FIG. 6.

Figure 7A:
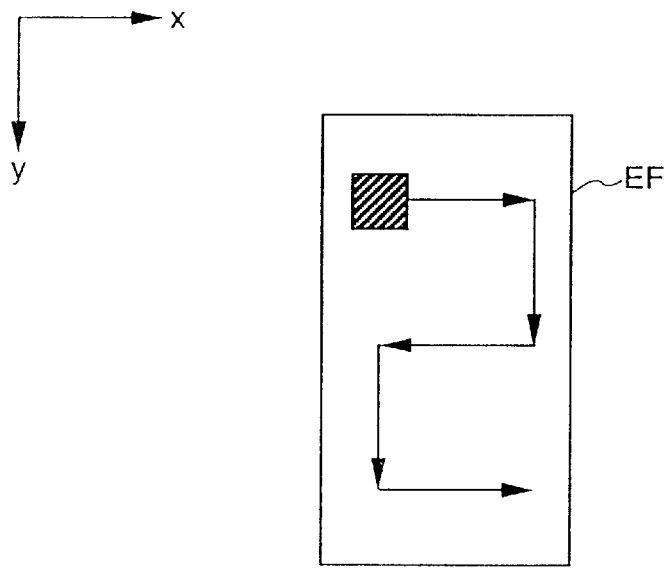
FIG. 7A is a view for explaining elementary exposure fields (EF)
Figure 7B:
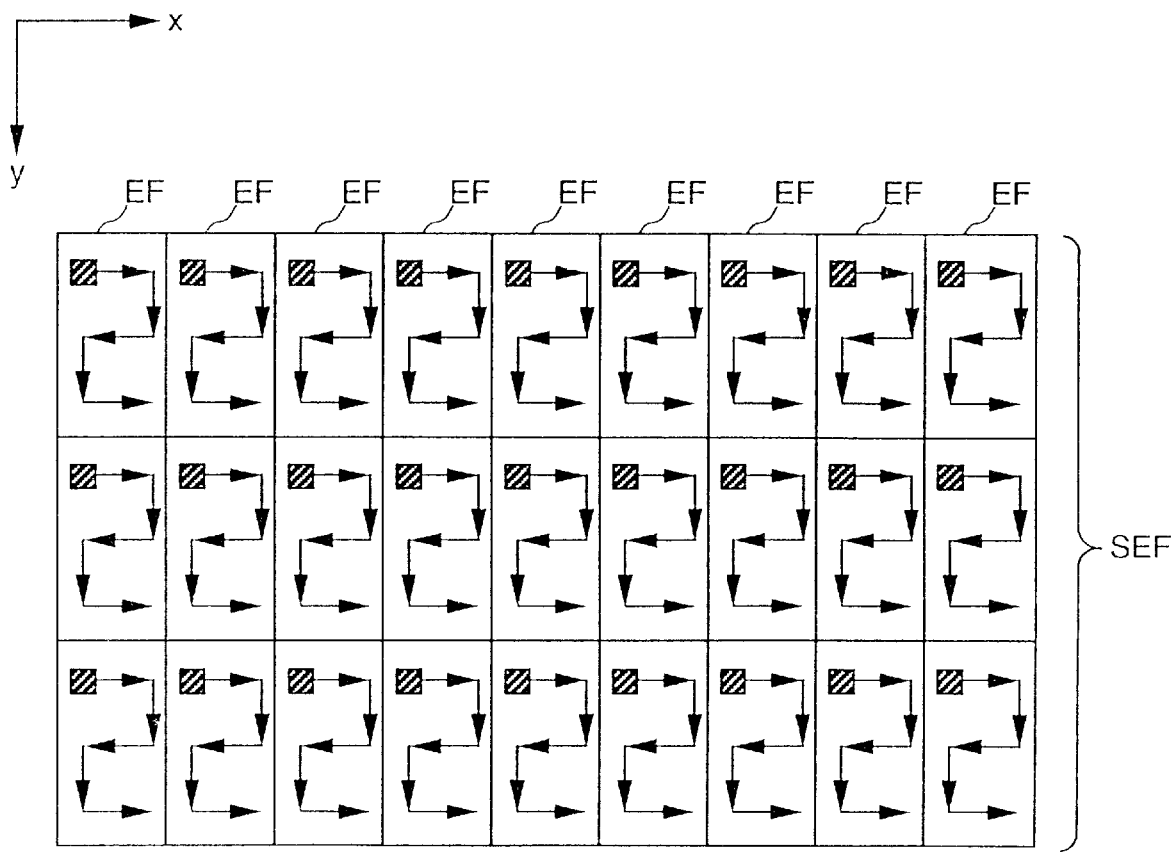
FIG. 7B is a view for explaining subarray exposure fields (SEF)

The control system 22 directs the deflection control circuit 17 based on the exposure control data from the memory 23 to deflect a plurality of electron beams from the elementary electron optical system array by the sub deflector 62 of the deflector 6. Also, the control system 22 directs the blanking control circuit 14 to turn on/off the blanking electrodes of the respective elementary electron optical systems in accordance with the pattern to be formed by exposure on the wafer 5. At this time, the X-Y stage 12 is continuously moving in the X-direction. An electron beam coming from one elementary electron optical system scans and exposes an elementary exposure field (EF) on the wafer 5 to have the full square as a start point, as shown in FIG. 7A. Also, as shown in FIG. 7B, the elementary exposure fields (EF) of the plurality of elementary electron optical systems in each subarray are set adjacent to each other. Consequently, a subarray exposure field (SEF) including a plurality of elementary exposure fields (EF) is exposed on the wafer 5.

Figure 8A:
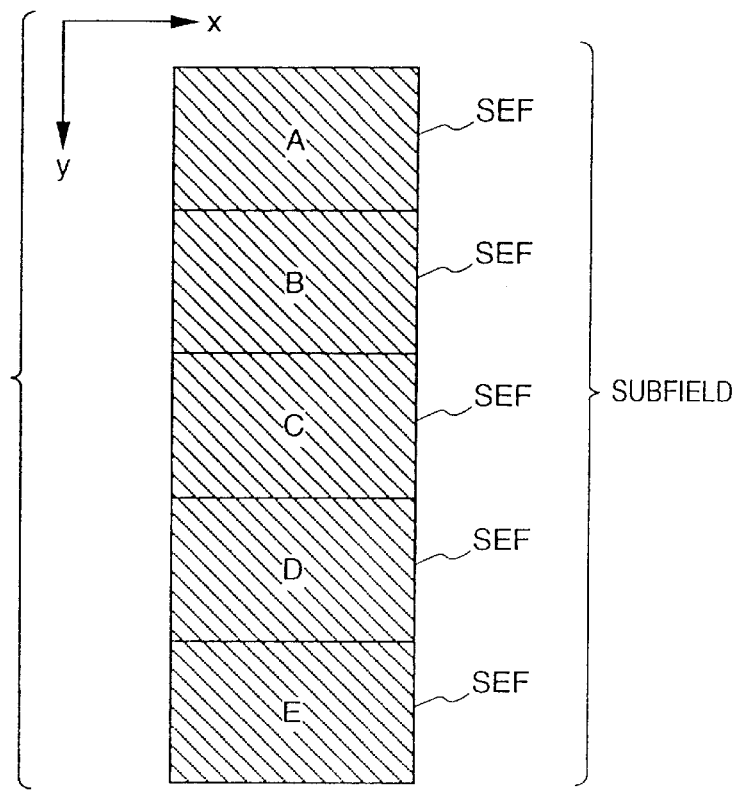
FIG. 8A is a view for explaining the relationship between the subarray exposure fields and subfields.

At the same time, a subfield made up of subarray exposure fields (SEF (A) to SEF (E)) is exposed on the wafer 5, as shown in FIG. 8A. In other words, a subfield made up of a plurality of elementary exposure fields (EF) is exposed.

Figure 8B:
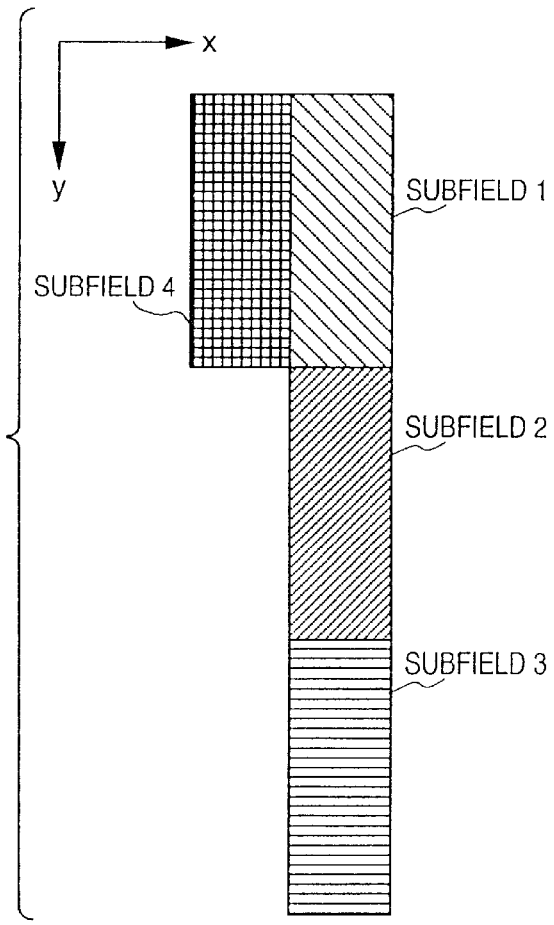
FIG. 8B is a view for explaining the subfields and exposure order.

The control system 22 directs the deflection control circuit 17 to deflect a plurality of electron beams coming from the elementary electron optical system array using the main deflector 61 of the deflector 6 so as to expose subfield 2 after exposure of subfield 1 shown in FIG. 8B. Again, as described above, the control system 22 directs the deflection control circuit 17 to deflect a plurality of electron beams coming from the elementary electron optical system array by the sub deflector 62 of the deflector 6, and directs the blanking control circuit 14 to turn on/off the blanking electrodes of the respective elementary electron optical systems in accordance with the pattern to be formed by exposure on the wafer 5, thus exposing subfield 2.

Figure 9:
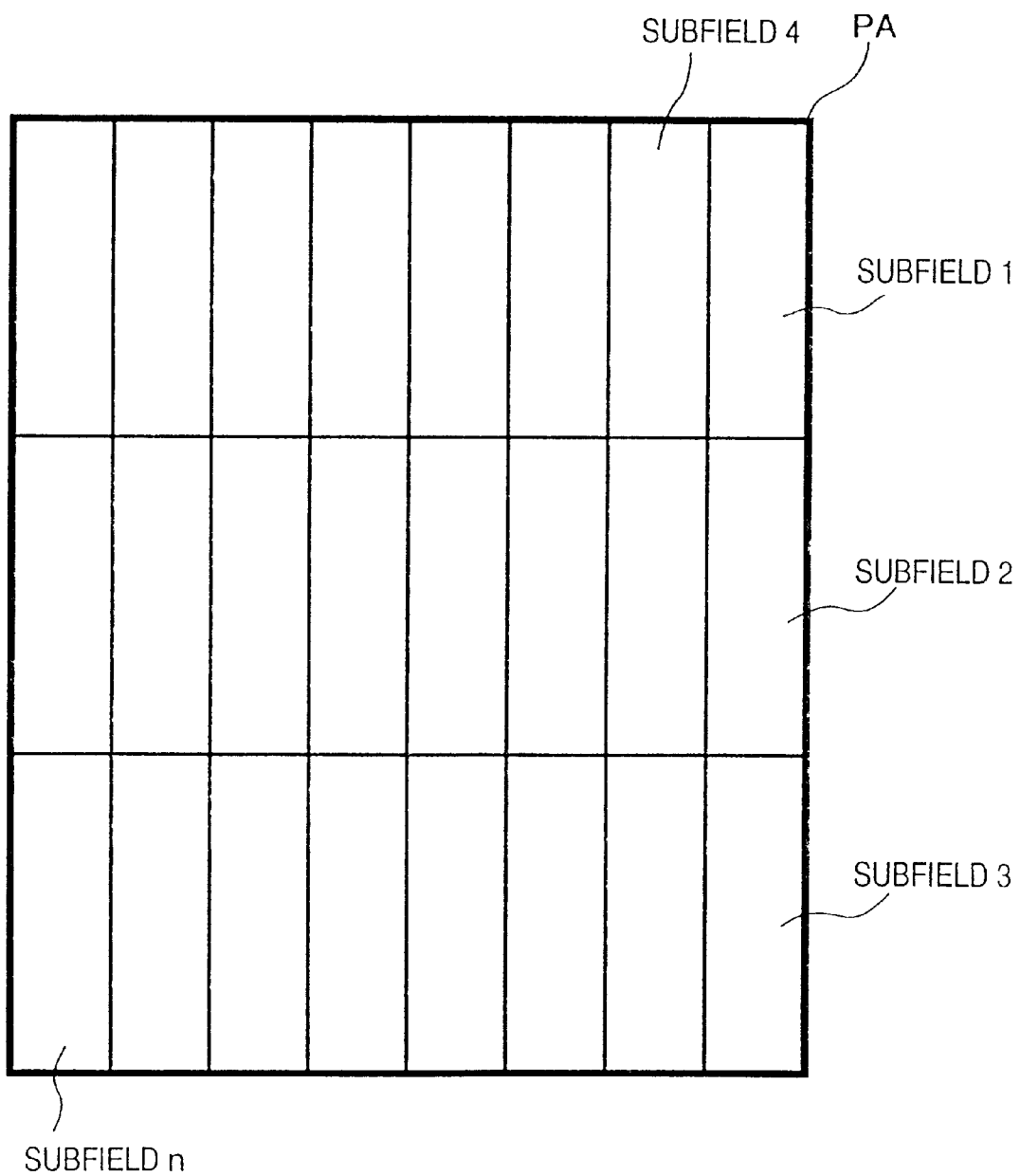
FIG. 9 is a view for explaining the relationship between the subfields and pattern area.

The subfields are then exposed in turn like subfields 3 and 4, as shown in FIG. 8B, thus forming a pattern on the wafer 5. More specifically, as shown in FIG. 9, if PA represents a pattern area on the wafer 5 where the pattern is formed based on pattern data, the electron beam exposure apparatus of this embodiment sequentially exposes the pattern area PA in units of subfields (1, 2, 3, . . . , n).

(Explanation of Exposure Control Data Generation)

The method of generating exposure control data of the electron beam exposure apparatus of this embodiment will be explained below.

Figure 10:
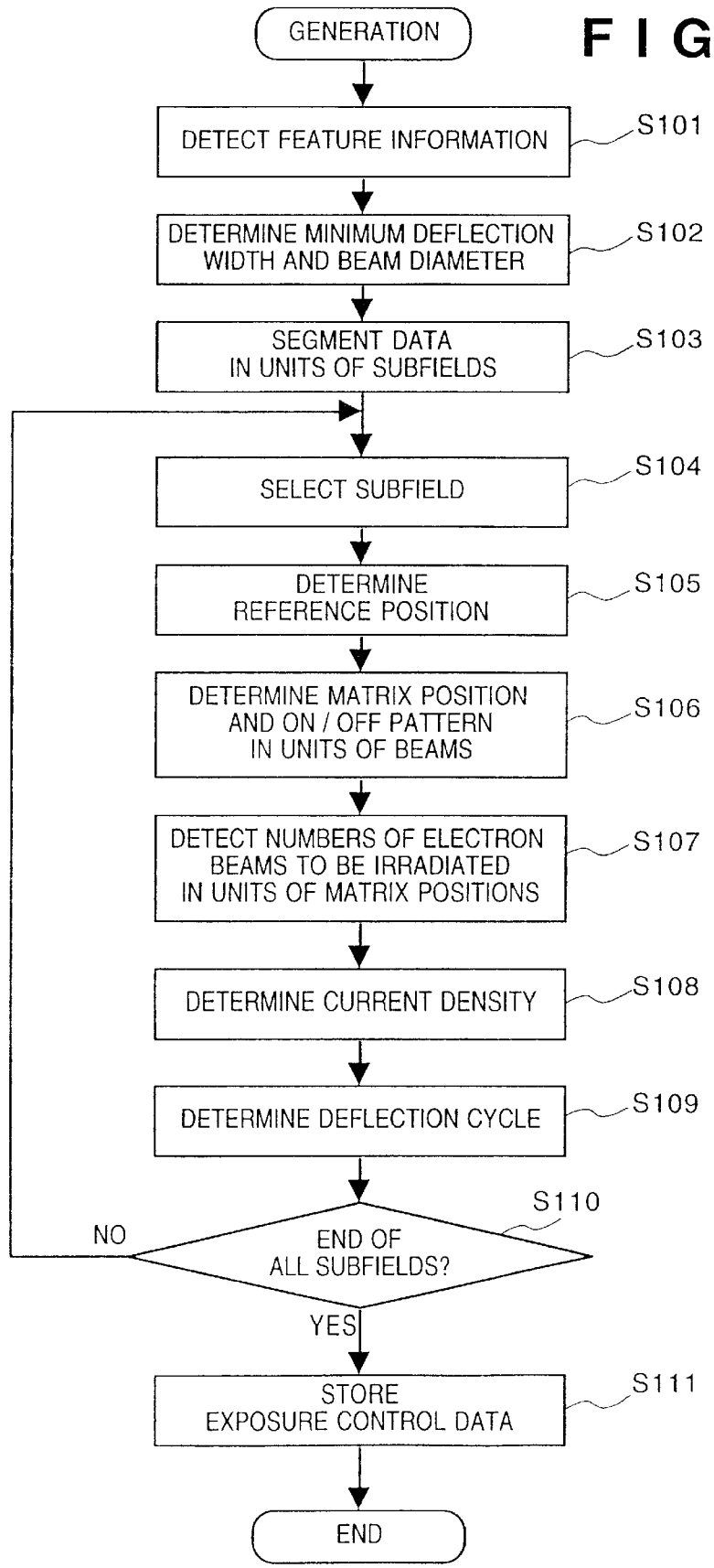
FIG. 10 is a flow chart for explaining exposure control data generation.

Upon reception of pattern data to be formed by exposure on the wafer, the CPU 25 executes processing for generating exposure control data, as shown in FIG. 10.

The respective steps will be described.

(Step S101)

Feature information (e.g., the minimum line width, type of line width, shape) of a pattern is detected from the pattern data. In this embodiment, the minimum line width is detected.

(Step S102)

The minimum deflection width that the sub deflector 62 gives an electron beam and the electron beam diameter (the size of an electron beam impinging on the wafer) is determined based on the detected feature information. In this embodiment, the minimum deflection width is determined so that an integer multiple of the minimum deflection width agrees with the matrix pitch (on the wafer) of a plurality of electron beams and approximately ¼ the minimum line width. Also, the electron beam diameter is determined to be nearly equal to the diameter of a circumscribed circle of a square having one side equal to the minimum deflection width.

(Step S103)

The input pattern data is segmented into data in units of subfields defined by the electron beam exposure apparatus of this embodiment.

(Step S104)

One subfield is selected.

(Step S105)

The deflection position (reference position) defined by the main deflector 61 upon exposing the selected subfield is determined.

(Step S106)

The pattern data of the selected subfield is segmented into pattern data in units of elementary exposure fields corresponding to the elementary electron optical systems, and a common matrix made up of matrix elements FME using the determined minimum deflection amount of the sub deflector 62 as a matrix spacing is set, thus converting the pattern data into those expressed on the common matrix in units of elementary electron optical systems. The processing pertaining to pattern data upon exposure using two elementary electron optical systems a and b will be described below for the sake of simplicity.

FIGS. 11A and 11B show patterns Pa and Pb to be formed by exposure by the neighboring elementary electron optical systems a and b on a common deflection matrix DM. Each elementary electron optical system irradiates an electron beam onto the wafer by turning off its blanking electrode at hatched matrix positions with pattern portions. For this purpose, the CPU 25 determines first regions FF (solid black portions) consisting of matrix positions corresponding to exposure positions of at least one of the elementary electron optical systems a and b, and second regions NN (blank portions) consisting of matrix positions when neither of the elementary electron optical systems a and b perform exposure, as shown in FIG. 11C, on the basis of the matrix position data to be exposed in units of elementary electron optical systems shown in FIGS. 11A and 11B. When a plurality of electron beams are located on the first region FF on the matrix, exposure is done by deflecting and settling the electron beams by the deflector 6 in units of minimum deflection widths (the matrix spacings), thus forming all the patterns to be drawn on the wafer by exposure. When a plurality of electron beams are located on the second region NN on the matrix, they are deflected without settling their positions, thereby attaining exposure while eliminating unnecessary deflection of the electron beams. In other words, after exposure of the first region (FF), when the electron beams are deflected to expose the next first region (FF) while skipping the second region (NN), the number of times of deflection that requires a long settling time can be reduced, and exposure can be attained within a shorter period of time. Subsequently, the CPU 25 determines the matrix positions of matrix elements to be exposed on the basis of data pertaining to the regions FF and NN shown in FIG. 11C. Also, the CPU 25 determines the ON/OFF patterns of blanking electrodes corresponding to the matrix positions to be settled of the electron beams in units of elementary electron optical systems on the basis of data representing the patterns shown in FIGS. 11A and 11B. Since the minimum deflection width and the deflection order in that matrix are already determined and, hence, matrix numbers are assigned in advance to the respective matrix elements, the matrix numbers are determined as the matrix positions.

(Step S107)

The number of electron beams to be irradiated onto the wafer for each matrix number (for each deflection) is detected. Furthermore, the maximum value (Nmax) of the numbers of electron beams to be irradiated onto the wafer in units of matrix numbers in the subfield (predetermined deflection region) is detected.

(Step S108)

When the area where electron beams are simultaneously irradiated onto the wafer remains nearly the same, blurring of electron beam images due to the Coulomb effect depends on the total current irradiated onto the wafer at that time. In the present invention, in order to confine the blurring produced by the Coulomb effect within a predetermined value, the total current to be irradiated onto the wafer is set constant, and the current density of electron beams is determined in accordance with the number of electron beams to be irradiated onto the wafer, in principle. However, changes in currents of electron beams in units of deflection positions require complicated control. For this reason, in this embodiment, the current density of electron beams upon exposing the selected subfield is determined based on the maximum value (Nmax) of the numbers of electron beams to be irradiated onto the wafer in units of matrix numbers, which is detected in step S107. More specifically, let Imax (A) be the total current to be irradiated onto the wafer to confine the blurring produced by the Coulomb effect within a predetermined value, and $\sigma$ ($cm^2$) be the size (irradiation area), on the wafer, of each electron beam having the same size (irradiation area). Then, the current density ($A/cm^2$) of electron beams upon exposing the selected subfield is determined by:

$$j = Imax/Nmax/\sigma \tag{2}$$

(Step S109)

Let D ($C/cm^2$) be the exposure amount required for each electron beam to form a desired dot pattern on the wafer, i.e., so-called sensitivity of a resist applied onto the wafer surface. Then, the settlement time (so-called exposure time) Ts (sec) at the deflection position of each electron beam is determined by equation (3) below. Note that $C = \int i\, dt = i \times s$ (A·sec).

$$Ts = D/j \tag{3}$$

Normally, if To (sec) represents the settlement wait time until the electron beam is deflected and is settled to a desired deflection position, a deflection cycle Td (sec) of the sub deflector 62 is given by:

$$Td = Ts + To \tag{4}$$

In this embodiment, since To is roughly constant, the deflection cycle Td of the sub deflector 62 is determined in correspondence with the determined current density of electron beams. If the number of electron beams to be irradiated onto the wafer is small, the current per electron beam increases, and the deflection cycle is shortened. As a result, the wafer can be exposed within a shorter period of time, and the throughput can be improved.

(Step S110)

It is checked if the processing in steps S104 to S109 is complete for all the subfields. If non-processed subfields remain (S110–No), the flow returns to step S104 to select the non-processed subfield. On the other hand, if the processing is complete for all the subfields (S110–Yes), the processing in step S111 is started.

(Step S111)

Upon completion of the processing in steps S104 to S109 for all the subfields, exposure control data including the minimum deflection width and electron beam diameter of the sub deflector 62, and exposure control data in units of subfields, each of which includes, as elements, the reference position determined by the main deflector 61, the electron beam current density, the deflection cycle of the sub deflector 62, the matrix positions determined by the sub deflector 62, and the ON/OFF pattern of the electron beams irradiated by the elementary electron optical systems at each matrix position, are stored.

In this embodiment, the above-mentioned processing steps are implemented by the CPU 25 of the electron beam exposure apparatus but may be implemented by another processing device, and the obtained exposure control data may be transferred to the CPU 25 to achieve the above object and to obtain the same effects as above.

(Explanation of Exposure Based on Exposure Control Data)

Figure 13:
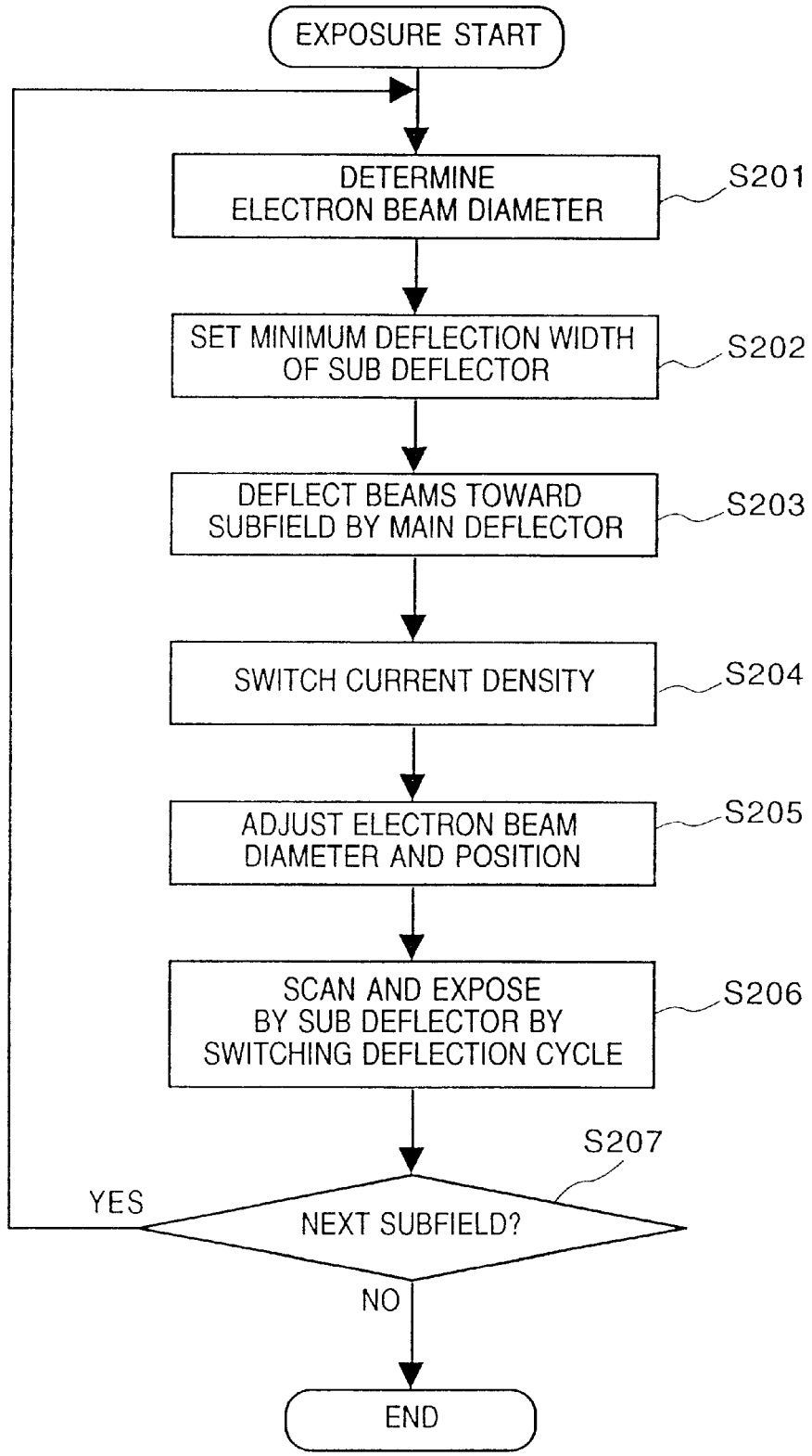
FIG. 13 is a flow chart for explaining exposure based on the exposure control data.

When the CPU 25 instructs the control system 22 to "execute exposure" via the interface 24, the control system 22 executes the steps shown in FIG. 13 on the basis of the exposure control data on the memory 23.

The individual steps will be explained below.

(Step S201)

The control system directs the focal length control circuit FC to change the focal lengths of the illumination electron optical system 2, thus setting the determined electron beam diameter.

(Step S202)

The control system 22 directs the deflection control circuit 17 to set the minimum deflection width of the sub deflector 62 at the determined value.

(Step S203)

The control system 22 directs the deflection control circuit 17 to deflect a plurality of electron beams coming from the elementary electron optical system array by the main deflector 61 so that the electron beams are located at the reference positions as start points upon exposing the subfield. Furthermore, the control system 22 directs the second focal point astigmatism control circuit 16 to control the dynamic focus coil 7 in correspondence with the deflection attained by the main deflector 61 on the basis of dynamic focal point correction data obtained in advance to correct the focal point position of the reduction electron optical system 4, and to control the dynamic stigmatic coil 8 on the basis of dynamic astigmatism correction data obtained in advance to correct astigmatism of the reduction electron optical system.

(Step S204)

The control system 22 directs the luminance control circuit BRC to control the voltage of the bias power supply BV so as to change the luminance (A/sr/cm$^2$) of the electron source of the electron gun 1, thereby changing the current density of electron beams to be projected onto the wafer to that corresponding to the subfield to be exposed. Also, the control system 22 controls to obtain a constant current density of electron beams within the corresponding subfield.

(Step S205)

When the luminance of the electron source of the electron gun 1 is changed, the size and position of the electron source also change slightly. Hence, the control system 22 instructs the focal length control circuit FC to change the focal lengths of the illumination electron optical system 2, thereby adjusting the electron beam diameter to restore the determined electron beam diameter. Also, the control system 22 controls the axis adjustment deflector AD to correct positional deviations by moving the position of the electron source relative to the illumination electron optical system 2 in the X- and Y-directions.

(Step S206)

The control system 22 directs the deflection control circuit 17 to switch the deflection cycle of the sub deflector 62 to that corresponding to the subfield to be exposed. Furthermore, a cycle signal defined by the deflection cycle is generated. Then, the control system 22 instructs the deflection control circuit 17 to deflect a plurality of electron beams coming from the elementary electron optical system array by the sub deflector 62 to the deflection positions defined by the exposure control data in units of switched minimum deflection widths in synchronism with the cycle signal. At the same time, the control system 22 directs the blanking control circuit 14 to turn on/off the blanking electrodes of the elementary electron optical systems in accordance with the pattern to be formed by exposure on the wafer 5.

Furthermore, in order to correct blurring of electron beams due to the Coulomb effect, the control system 22 directs the refocus control circuit 19 to adjust the focal point position of the reduction electron optical system 4 by the refocus coil 9 on the basis of the number of electron beams to be irradiated onto the wafer without being intercepted by the blanking electrodes. At this time, the X-Y stage 12 is continuously moving in the X-direction, and the drawing deflection control circuit 17 controls the deflection positions of the electron beams in consideration of the moving amount of the X-Y stage 12.

As described above, consequently, an electron beam coming from one elementary electron optical system scans and exposes an elementary exposure field (EF) on the wafer 5 to have the full square as a start point, as shown in FIG. 7A. Also, as shown in FIG. 7B, the elementary exposure fields (EF) of the plurality of elementary electron optical systems in each subarray are set adjacent to each other. Consequently, a subarray exposure field (SEF) including a plurality of elementary exposure fields (EF) is exposed on the wafer 5. At the same time, a subfield made up of subarray exposure fields (SEF(A) to SEF(E)) is exposed on the wafer 5, as shown in FIG. 8A. In other words, the subfield made up of a plurality of elementary exposure fields (EF) is exposed.

(Step S207)

If the next subfield to be exposed remains (S207–Yes), the flow returns to step S203; otherwise (S207–No), exposure ends.

As described above, according to the present invention, a multi-electron beam exposure method and apparatus, which can achieve maximum throughput with shortest process time while confining the blurring due to the Coulomb effect within a predetermined value by appropriately setting the current density of the electron beams can be provided.

(Second Embodiment)

In the first embodiment, the numbers of electron beams to be simultaneously irradiated onto the wafer in each subfield are detected in units of deflection positions, their maximum value is detected, and the current density of electron beams is determined based on that maximum value upon exposing the corresponding subfield.

In the second embodiment, the numbers of electron beams to be simultaneously irradiated onto the wafer in units of deflection positions may be detected in all the exposure fields on the wafer, their maximum value may be detected, and the current density of electron beams may be determined based on that maximum value, so that the entire wafer surface is exposed based on the current density.

(Explanation of Method of Manufacturing Device of the Present Invention)

An embodiment of a device manufacturing method using the above-mentioned electron beam exposure apparatus will be explained below.

Figure 14:
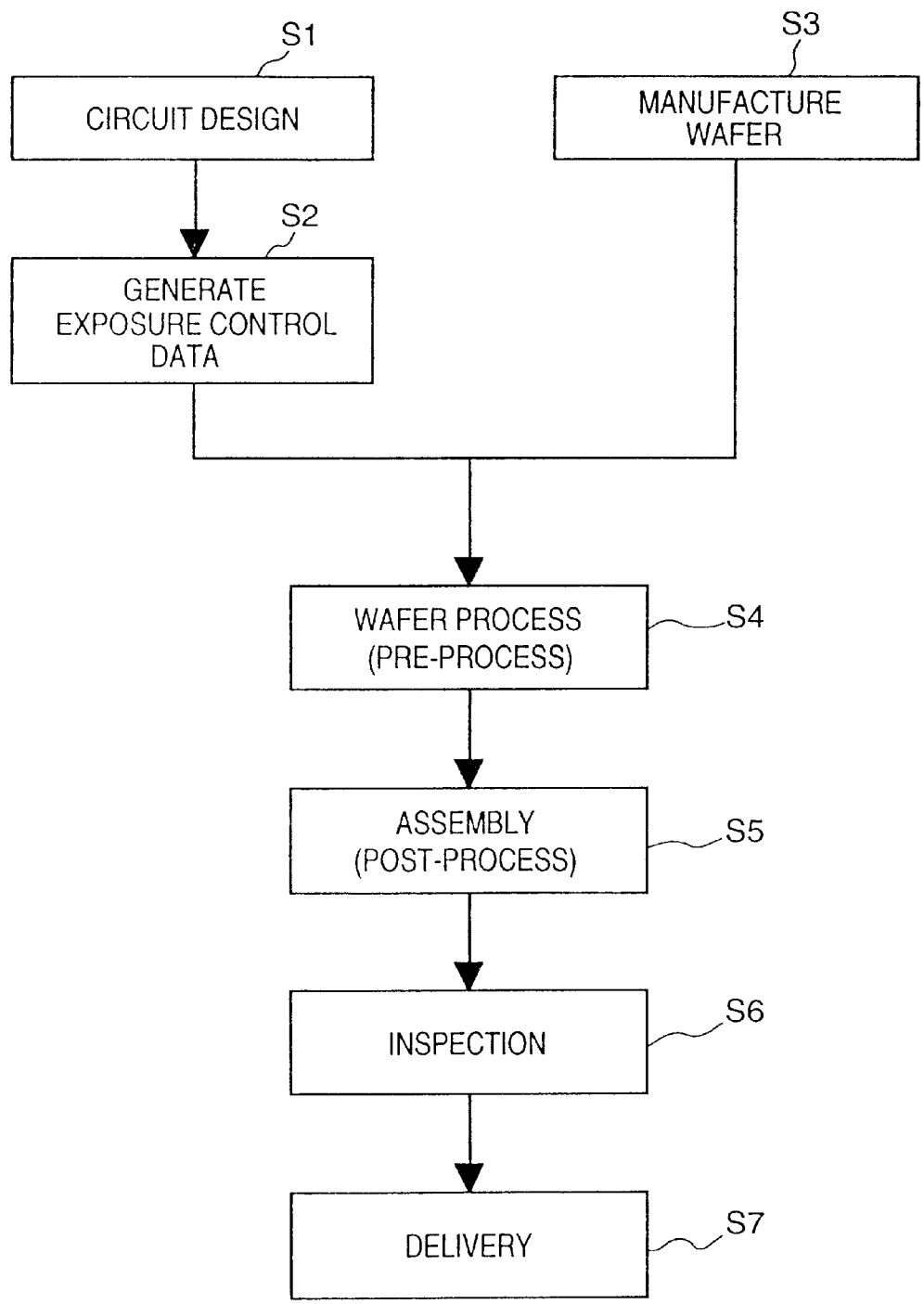
FIG. 14 is a flowchart for explaining the manufacturing flow of microdevices.

FIG. 14 shows the flow in the manufacture of a microdevice (semiconductor chips such as ICs, LSIs, liquid crystal devices, CCDs, thin film magnetic heads, micromachines, and the like). In step 1 (circuit design), the circuit design of a semiconductor device is done. In step 2 (generate exposure control data), the exposure control data of the exposure apparatus is generated based on the designed circuit pattern. Separately, in step 3 (manufacture wafer), a wafer is manufactured using materials such as silicon and the like. Step 4 (wafer process) is called a pre-process, and an actual circuit is formed by lithography on the wafer using the exposure apparatus input with the prepared exposure control data, and the manufactured wafer. The next step 5 (assembly) is called a post-process, in which semiconductor chips are assembled using the wafer obtained in step 4, and includes an assembly process (dicing, bonding), a packaging process (encapsulating chips), and the like. In step 6 (inspection), inspections such as operation tests, durability tests, and the like of semiconductor devices assembled in step 5 are conducted. Semiconductor devices are completed via these processes, and are delivered (step 7).

Figure 15:
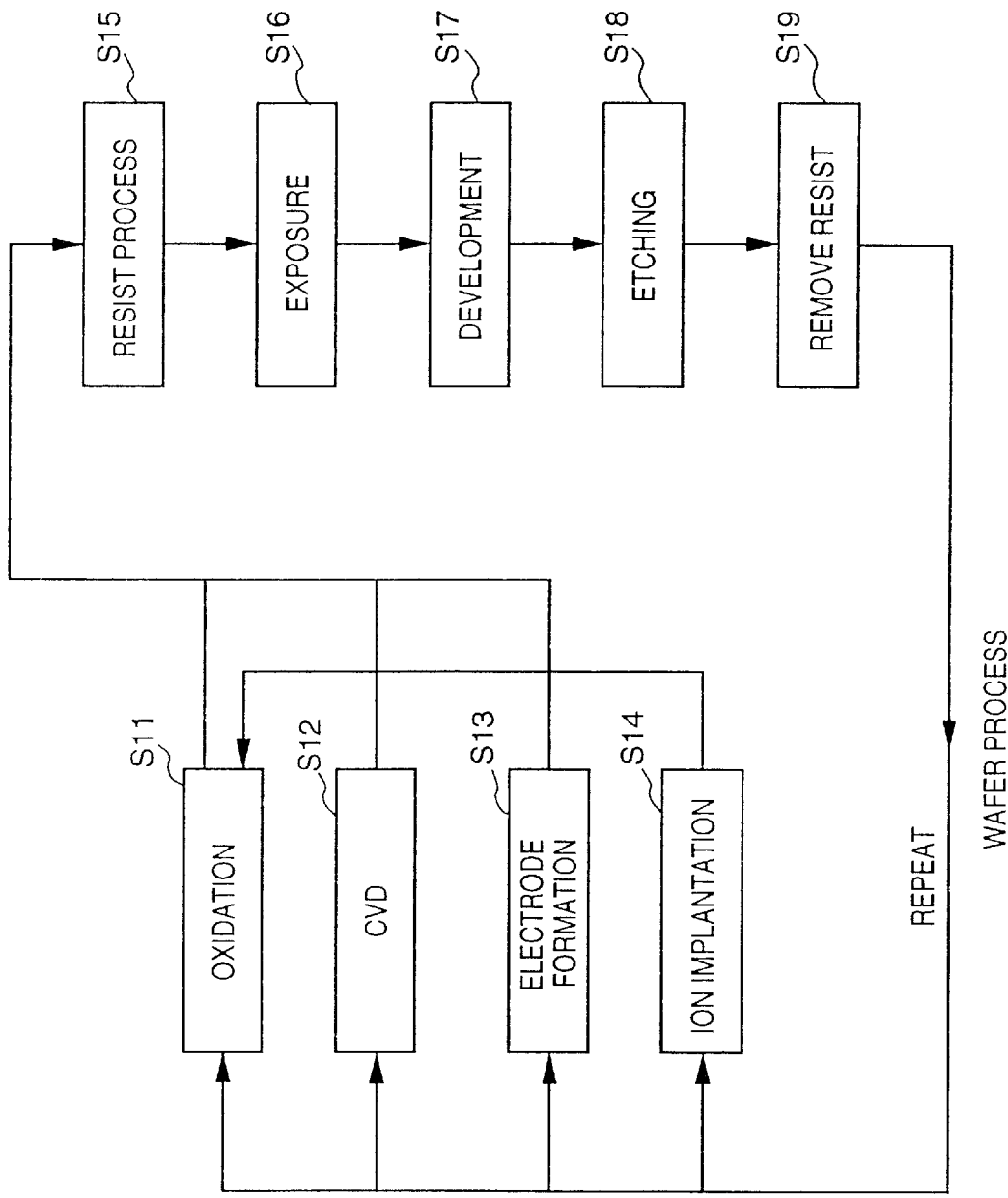
FIG. 15 is a flow chart for explaining the wafer process.

FIG. 15 shows the detailed flow of the wafer process. In step 11 (oxidation), the surface of the wafer is oxidized. In step 12 (CVD), an insulating film is formed on the wafer surface. In step 13 (electrode formation), electrodes are formed by deposition on the wafer. In step 14 (ion implantation), ions are implanted into the wafer. In step 15 (resist process), a photosensitive agent is applied on the wafer. In step 16 (exposure), the circuit pattern on the mask is printed on the wafer by exposure using the above-mentioned exposure apparatus. In step 17 (development), the exposed wafer is developed. In step 18 (etching), a portion other than the developed resist image is removed by etching. In step 19 (remove resist), the resist film which has become unnecessary after the etching is removed. By repeating these steps, multiple circuit patterns are formed on the wafer.

According to the manufacturing method of this embodiment, a highly integrated semiconductor device which is not easy to manufacture by the conventional method can be manufactured at low cost.

As described above, according to the present invention, a multi-electron beam exposure method and apparatus, which can achieve maximum throughput with shortest process time while confining the blurring due to the Coulomb effect within the predetermined value by appropriately setting the current density of the electron beams can be provided.

The present invention is not limited to the above embodiments and various changes and modifications can be made within the spirit and scope of the present invention. Therefore, to appraise the public of the scope of the present invention, the following claims are made.

What is claimed is:

1. An electron beam exposure method for forming a pattern by exposure on a substrate using a plurality of electron beams, comprising:

the projection step of projecting the plurality of electron beams onto the substrate via a reduction electron optical system;

the deflection step of deflecting the plurality of electron beams to be projected toward the substrate;

the control step of individually controlling an ON/OFF pattern of the plurality of electron beams in units of deflection positions;

the detection step of detecting, in advance, the number of electron beams to be irradiated onto the substrate in units of deflection positions; and the determination step of determining a current density of the plurality of electron beams on the basis of the detected number of electron beams.

2. The method according to claim 1, wherein the detection step includes the step of detecting, in advance, the number of electron beams to be irradiated onto the substrate in units of deflection positions on the basis of pattern data of the pattern.

3. The method according to claim 1, further comprising the deflection cycle determination step of determining a deflection cycle upon deflecting the plurality of beams on the basis of the current density of the plurality of electron beams determined in the determination step.

4. The method according to claim 1, wherein the determination step includes the step of determining the current density of the plurality of electron beams within a predetermined deflection region on the basis of a maximum value of the detected numbers of electron beams in units of deflection positions within the deflection region.

5. The method according to claim 3, wherein the determination step includes the step of determining the current density of the plurality of electron beams within a predetermined deflection region on the basis of a maximum value of the detected numbers of electron beams in units of deflection positions within the deflection region.

6. The method according to claim 4, wherein the current density of the plurality of electron beams is set constant within the deflection region.

7. The method according to claim 5, wherein the current density of the plurality of electron beams is set constant within the deflection region.

8. The method according to claim 1, wherein the plurality of electron beams are those coming from an electron source for emitting electrons, and said method further comprises the luminance adjustment step of adjusting a luminance of the electron source on the basis of the determined current density of the plurality of electron beams.

9. The method according to claim 8, further comprising the beam size adjustment step of adjusting sizes of the plurality of electron beams on the basis of the adjusted luminance of the electron beam.

10. The method according to claim 8, further comprising the position adjustment step of adjusting positions of the plurality of electron beams on the basis of the adjusted luminance of the electron beam.

11. A device manufacturing method of manufacturing a device by forming a pattern by exposure on a substrate using a plurality of electron beams, wherein an electron beam exposure method of claim 1 is used as an electron beam exposure method using the plurality of electron beams.

12. An electron beam exposure apparatus for forming a pattern by exposure on a substrate using a plurality of electron beams, comprising:

a reduction electron optical system for projecting the plurality of electron beams onto the substrate;

deflection means for deflecting the plurality of electron beams to be projected toward the substrate;

irradiation control means for individually controlling an ON/OFF pattern of the plurality of electron beams in units of deflection positions;

current adjustment means for adjusting a current of the plurality of electron beams; and control means for controlling said current adjustment means to adjust a current density of the plurality of electron beams on the basis of the pre-detected number of electron beams to be irradiated onto the substrate in units of deflection positions.

13. The apparatus according to claim 12, wherein said control means adjusts a deflection cycle of said deflection means upon deflecting the plurality of electron beams on the basis of the adjusted current density of the plurality of electron beams.

14. The apparatus according to claim 12, wherein said control means controls said current adjustment means to adjust the current density of the plurality of electron beams within a predetermined deflection region on the basis of a maximum value of the numbers of electron beams in units of deflection positions within the deflection region.

15. The apparatus according to claim 13, wherein said control means controls said current adjustment means to adjust the current density of the plurality of electron beams within a predetermined deflection region on the basis of a maximum value of the numbers of electron beams in units of deflection positions within the deflection region.

16. The apparatus according to claim 14, wherein said current adjustment means sets the current density of the plurality of electron beams to be constant within the deflection region.

17. The apparatus according to claim 15, wherein said current adjustment means sets the current density of the plurality of electron beams to be constant within the deflection region.

18. The apparatus according to claim 12, wherein the plurality of electron beams are those coming from an electron source for emitting electrons, and said apparatus further comprises luminance adjustment means for adjusting a luminance of the electron source on the basis of the current density of the plurality of electron beams adjusted by said current adjustment means.

19. The apparatus according to claim 18, further comprising shape adjustment means for adjusting sizes of the plurality of electron beams on the basis of the adjusted luminance of the electron beam.

20. The apparatus according to claim 18, further comprising position adjustment means for adjusting positions of the plurality of electron beams on the basis of the adjusted luminance of the electron beam.

21. A device manufacturing apparatus for manufacturing a device by forming a pattern by exposure on a substrate using a plurality of electron beams, wherein an electron beam exposure apparatus of claim 12 is used as an electron beam exposure apparatus using the plurality of electron beams.

22. An electron beam exposure method comprising:

the feature information detection step of detecting feature information used for forming a pattern by exposure on the basis of input pattern data;

the feature information determination step of determining a minimum deflection width and electron beam diameter on the basis of the detected feature information;

the data segmentation step of segmenting data in units of subfields serving as exposure fields on the basis of the input pattern data;

the subfield selection step of selecting one subfield;

the reference position determination step of determining a reference position of a main deflector upon exposing the selected subfield;

the irradiation determination step of segmenting pattern data for the selected subfield into pattern data in units of elementary electron optical systems, and determining an ON/OFF pattern of electron beams in units of predetermined matrix elements;

the irradiated electron beam number detection step of detecting the numbers of electron beams to be simultaneously irradiated in units of matrix elements;

the current density determination step of calculating a current density on the basis of a maximum value of the numbers of electron beams to be simultaneously irradiated in units of matrix elements; and the deflection cycle determination step of calculating an exposure time at a deflection position on the basis of the calculated current density to attain exposure within a shortest period of time.

23. The method according to claim 22, wherein the feature information is a minimum line width of the pattern.

24. The method according to claim 22, wherein the feature information is a type of line width of the pattern.

25. The method according to claim 22, wherein the feature information is a shape of the pattern.

* * * * *

UNITED STATES PATENT AND TRADEMARK OFFICE
CERTIFICATE OF CORRECTION

PATENT NO. : 6,137,113
DATED : October 24, 2000
INVENTOR(S) : MASATO MURAKI

It is certified that error appears in the above-identified patent and that said Letters Patent is hereby corrected as shown below:

COLUMN 4:
Line 22, "part" should read --parts--.

COLUMN 5:
Line 9, "part" should read --parts--.

COLUMN 9:
Line 41, "point-astigmatism" should read --point astigmatism--.

COLUMN 12:
Line 23, "density" should read --density j--.

COLUMN 15:
Line 47, "appraise" should read --apprise--.

Signed and Sealed this

Twenty-second Day of May, 2001

*Attest:*

NICHOLAS P. GODICI

*Attesting Officer*   *Acting Director of the United States Patent and Trademark Office*